United States Patent [19]

Kodama et al.

[11] Patent Number: 4,932,000
[45] Date of Patent: Jun. 5, 1990

[54] SEMICONDUCTOR MEMORY DEVICE HAVING PSEUDO ROW DECODER

[75] Inventors: Yukinori Kodama, Yokohama; Takaaki Furuyama, Kawasaki, both of Japan

[73] Assignees: Fujitsu Limited; Fujitsu Limited

[21] Appl. No.: 355,630

[22] Filed: May 23, 1989

[30] Foreign Application Priority Data

May 30, 1988 [JP] Japan .................. 63-130361

[51] Int. Cl.$^5$ .............................................. G11C 8/00
[52] U.S. Cl. ........................... 365/230.06; 365/230.03
[58] Field of Search ............... 365/203, 230.03, 230.06

[56] References Cited

U.S. PATENT DOCUMENTS 4,399,519 8/1963 Masuda et al. ................ 365/189.06
4,731,761 3/1988 Kobayashi ..................... 365/189.06

*Primary Examiner*—James W. Moffitt
*Attorney, Agent, or Firm*—Armstrong, Nikaido, Marmelstein, Kubovcik & Murray

[57] ABSTRACT

A semiconductor memory device includes: a memory cell array including a plurality of word lines; a row pre-decoding unit responsive to a row address signal, outputting a plurality of row pre-decode signals with units of a group having signals of a number corresponding to a combination of each logic level of a predetermined plurality of bits of the row address signal; a row pre-decode wiring for transmitting the plurality of row pre-decode signals; a row main decoder responsive to one signal in each group of the plurality of row pre-decode signals, carrying out a main decoding for selecting one of the plurality of word lines; a pseudo row decoder having substantially same electrical characteristics as the row main decoder, carrying out a simulation of the main decoding in response to the plurality of row pre-decode signals output on row pre-decode wiring; and a word line driver for driving a word line selected by the row main decoder to a predetermined level. An operation of the word line driver is started in response to an activation of the pseudo row decoder, thereby excluding a possibility of an erroneous selection of a word line and preventing an unnecessary prolongation of an access time.

12 Claims, 6 Drawing Sheets

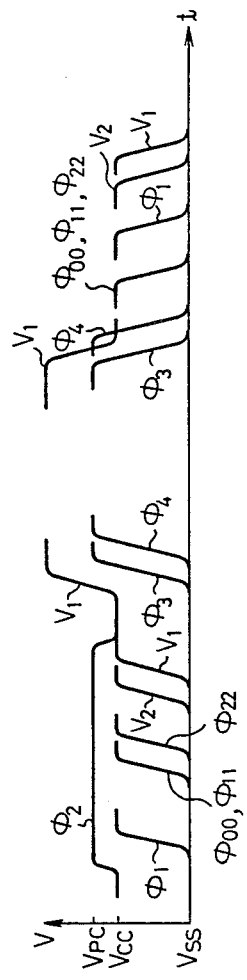
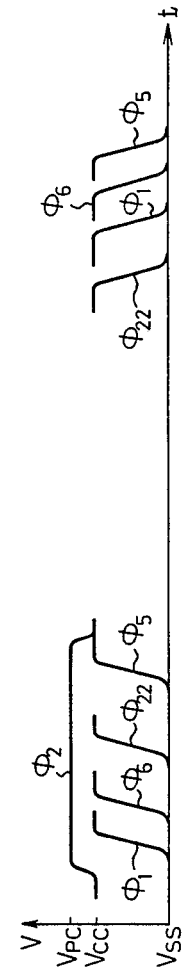
Fig. 7A ROW MAIN DECODER
Fig. 7B PSEUDO ROW DECODER

SEMICONDUCTOR MEMORY DEVICE HAVING PSEUDO ROW DECODER

BACKGROUND OF THE INVENTION

1. Field of the Invention

The present invention relates to a semiconductor memory device and, more particularly, to a technique of determining a timing at which a word line is selected, for example, when a level thereof is raised, using a row pre-decode signal.

2. Description of the Related Art

In a semiconductor memory device such as a dynamic random access memory (DRAM), a static random access memory (SRAM) or the like, a memory access operation is carried out as follows: first, a pre-decoding is carried out in advance by a row pre-decoder based on a combination of each logic level of a predetermined plurality of bits of an address signal; next, a row pre-decode signal is generated; next, a main decoding for selecting a word line is started by a row main decoder based on the row pre-decode signal and, at the same time, a word line driver is activated based on the row pre-decode signal; and thus, the main decoding is completed by the row main decoder, that is, a level of the word line to be selected is raised.

In this case, a predetermined wait time is needed from when the row pre-decode signal is output until the operation of the word line driver is started. This wait time corresponds to a time required until the row main decoder completes its main decoding in response to the row pre-decode signal. In a known conventional approach, the wait time is realized by a train of delay inverters. Concretely, the wait time is realized by suitably selecting the number of logic stages covering from the row pre-decode signal (wiring) to the word line driver on the chip.

According to this approach, however, it is difficult to always realize an optimum delay time due to nonuniformity of process, fluctuation of temperature, or the like. Therefore, where the wait time is too much shorter than a time originally needed, a problem occurs in that another word line different from a word line to be originally selected in a selection of a word line is erroneously selected. Conversely, where the wait time is too much longer than the time originally needed, another problem occurs in that the access time is unnecessarily prolonged.

SUMMARY OF THE INVENTION

An object of the present invention is to provide a semiconductor memory device which can exclude a possibility of an erroneous selection of a word line and prevent an unnecessary prolongation of an access time.

The above object is attained by providing a semiconductor memory device including a memory cell array including a plurality of word lines; a row pre-decoding unit responsive to a row address signal, outputting a plurality of row pre-decode signals with units of a group having signals of a number corresponding to a combination of each logic level of a predetermined plurality of bits of the row address signal; a row pre-decode wiring for transmitting the plurality of row pre-decode signals; a row main decoder responsive to one signal in each group of the plurality of row-pre-decode signals, carrying out a main decoding for selecting one of the plurality of word lines; a pseudo row decoder having substantially same electrical characteristics as said row main decoder, carrying out a simulation of said main decoding in response to said plurality of row pre-decode signals output on said row pre-decode wiring; and a word line driver for driving a word line selected by the row main decoder to a predetermined level, an operation of the word line driver being started in response to an activation of the pseudo row decoder.

BRIEF DESCRIPTION OF THE DRAWINGS

Other objects and features of the present invention will be described in detail hereinafter by way of preferred embodiments with reference to the accompanying drawings, in which:

FIGS. 7A and 7B are timing charts for explaining the decoding operation of the circuit shown in FIG. 3.

DESCRIPTION OF THE PREFERRED EMBODIMENTS

Figure 1:
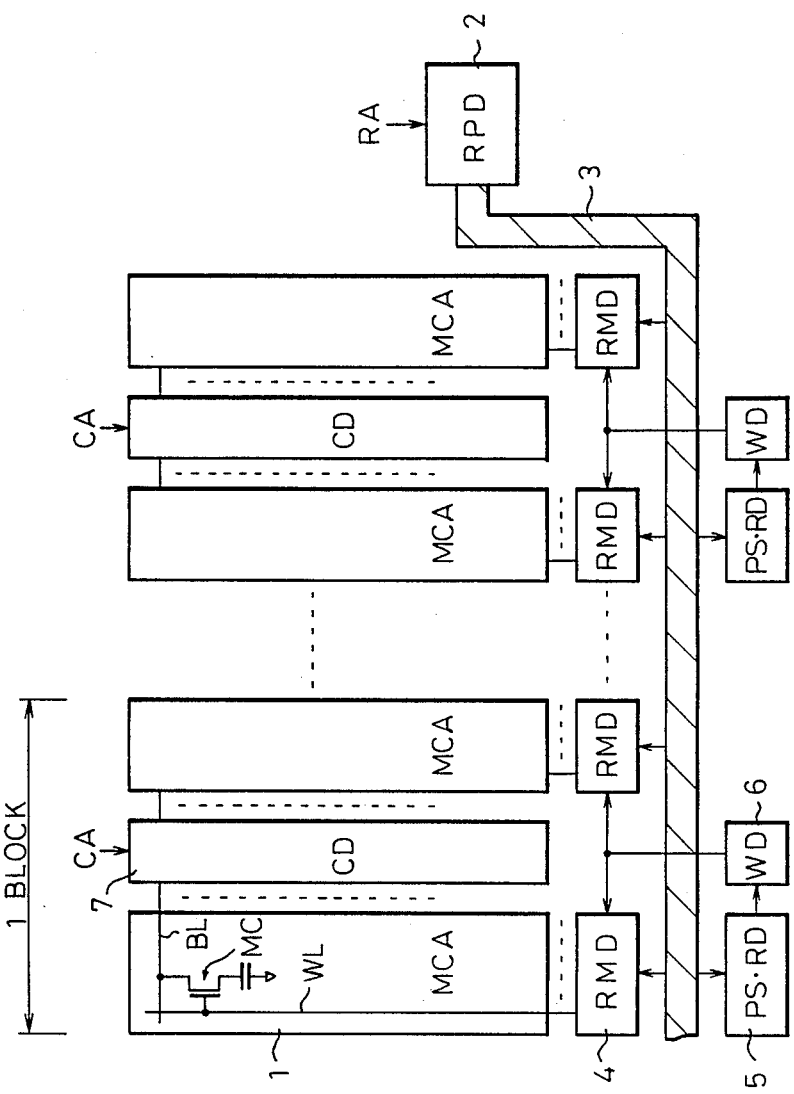
FIG. 1 is a view schematically illustrating a fundamental constitution of the semiconductor memory device according to the present invention.

FIG. 1 schematically illustrates a fundamental constitution of the semiconductor memory device according to the present invention.

In FIG. 1, reference 1 denotes a memory cell array (MCA) having a memory cell MC, for example, a dynamic type cell of one transistor and one capacitor, provided at each intersection between a plurality of word lines WL and a plurality of bit lines BL; reference 2 a row pre-decoding unit (RPD) which carries out a pre-decoding in response to a row address signal RA and outputs a plurality of row pre-decode signals; reference 3 a row pre-decode wiring (shown by a hatched portion) for transmitting the row pre-decode signals; reference 4 a row main decoder (RMD) which carries out a main decoding for selecting one of the plurality of word lines in response to a combination of a predetermined plurality of row pre-decode signals on the row pre-decode wiring; reference 5 a pseudo row decoder (PS, RD) constituted equivalently to the row main decoder; reference 6 a word line driver (WD) which starts its operation in response to an output of the pseudo row decoder and drives a selected word line to a predetermined level by way of the row main decoder; and reference 7 a column decoder (CD) including a sense amplifier for selecting one of the plurality of bit lines in response to a column address signal CA and amplifying a level of the data read from a selected cell, respectively.

The pseudo row decoder 5 includes transistors having the same number of logic stages and the same gate length and gate width as those in the row main decoder 4. As stated later in detail, the pseudo row decoder 5 responds to a group of signals arriving last at the pseudo row decoder among the plurality of row pre-decode signals output on the row pre-decode wiring 3 and carries out a simulation of the main decoding of the row main decoder 4.

Two memory cell arrays 1 and one column decoder 7 provided therebetween constitute one block. For each block, two row main decoders 4, one pseudo row decoder 5 and one word line driver 6 are allocated. Also, the row pre-decoding unit 2 and the row pre-decode wiring 3 are allocated for a plurality of blocks.

Figure 2:
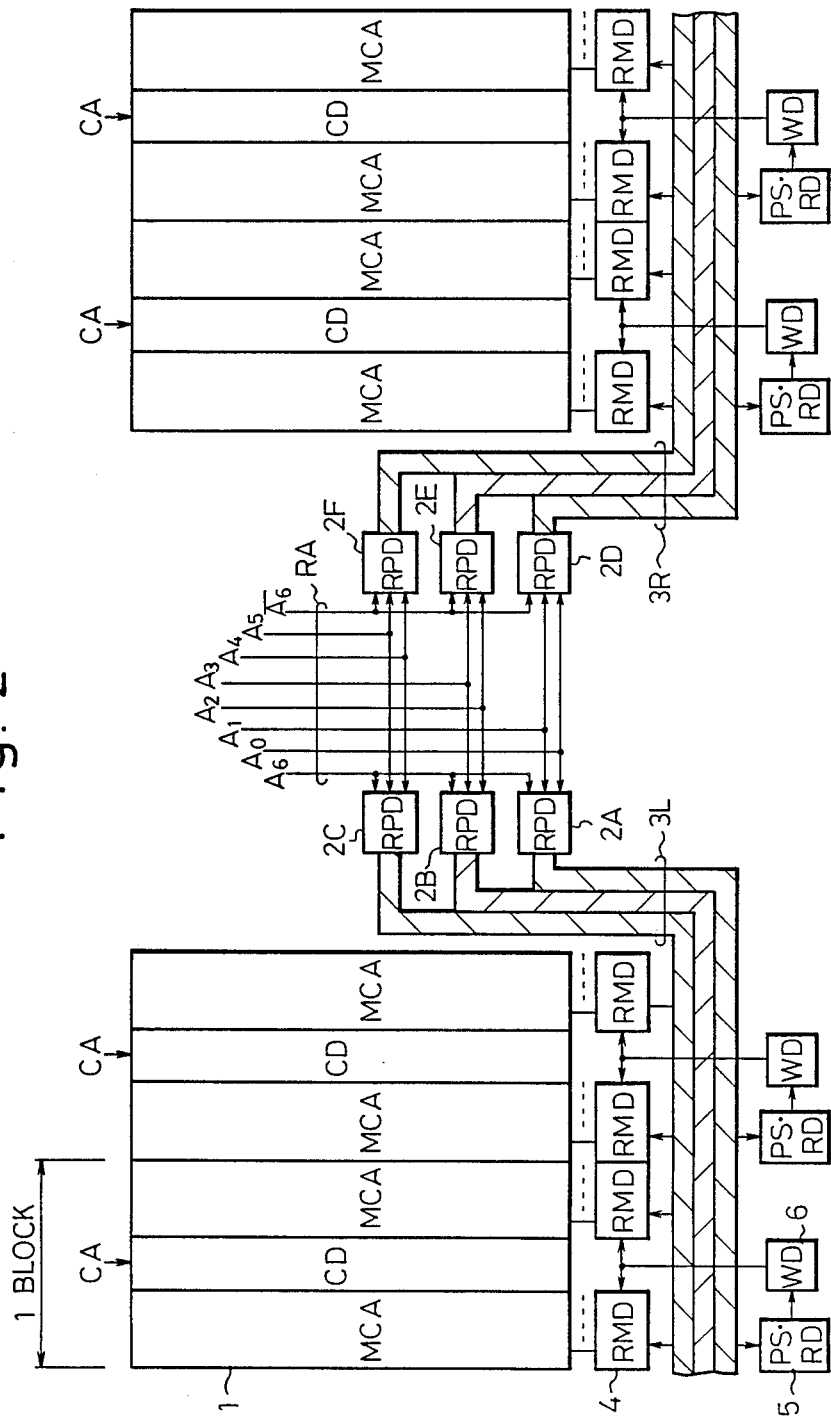
FIG. 2 is a view schematically illustrating an entire constitution of an embodiment of the present invention.

FIG. 2 schematically illustrates an entire constitution of an embodiment of the present invention.

In the illustrated example, the same references as those used in FIG. 1 indicate identical constituent elements and thus the explanation thereof is omitted. Also, for simplification of the explanation, the illustration of FIG. 2 shows the case that the row address signal RA consists of seven address bits $A_0$–$A_6$. References 2A–2F denote row pre-decoders and references 3L, 3R denote row pre-decode wirings. The corresponding two row pre-decoders 2A, 2D; 2B, 2E; 2C, 2F carry out a pre-decoding in response to the address bits $A_0$, $A_1$; $A_2$, $A_3$; $A_4$, $A_5$, respectively.

Referring to FIG. 2, a plurality of memory cell arrays (MCA) are divided into two regions (in the illustrated example, left and right sides) and six row pre-decoders 2A–2F are provided between the two regions. A first half of the row pre-decoders 2A, 2B, 2C are allocated for the left region and a second half thereof 2D, 2E, 2F are allocated for the right region. One of the first and second halves is selected based on one address bit $A_6$ ($\overline{A_6}$) of the row address signal RA. Namely, when the address bit $A_6$ is at "H" level, the row pre-decoders 2A, 2B, 2C on the left side are selected to be active and the row pre-decoders 2D, 2E, 2F on the right side are brought to an inactive state. Conversely, when the complementary address bit $\overline{A_6}$ is at "H" level, the reverse selection state is realized.

Also, the row pre-decoder 2C (2F) is located at the farthest position from the corresponding pseudo row decoder 5 among the row pre-decoders 2A–2C (2D–2F). Accordingly, the row pre-decode signals output from the row pre-decoder 2C (2F) arrive last at the pseudo row decoder 5 among all of the row pre-decode signals output on the row pre-decode wiring 3L (3R).

Next, a concrete circuit constitution of main parts of the device shown in FIG. 2 will be explained with reference to FIG. 3. The illustrated example shows a circuit constitution corresponding to one block shown in FIG. 2.

Figure 3:
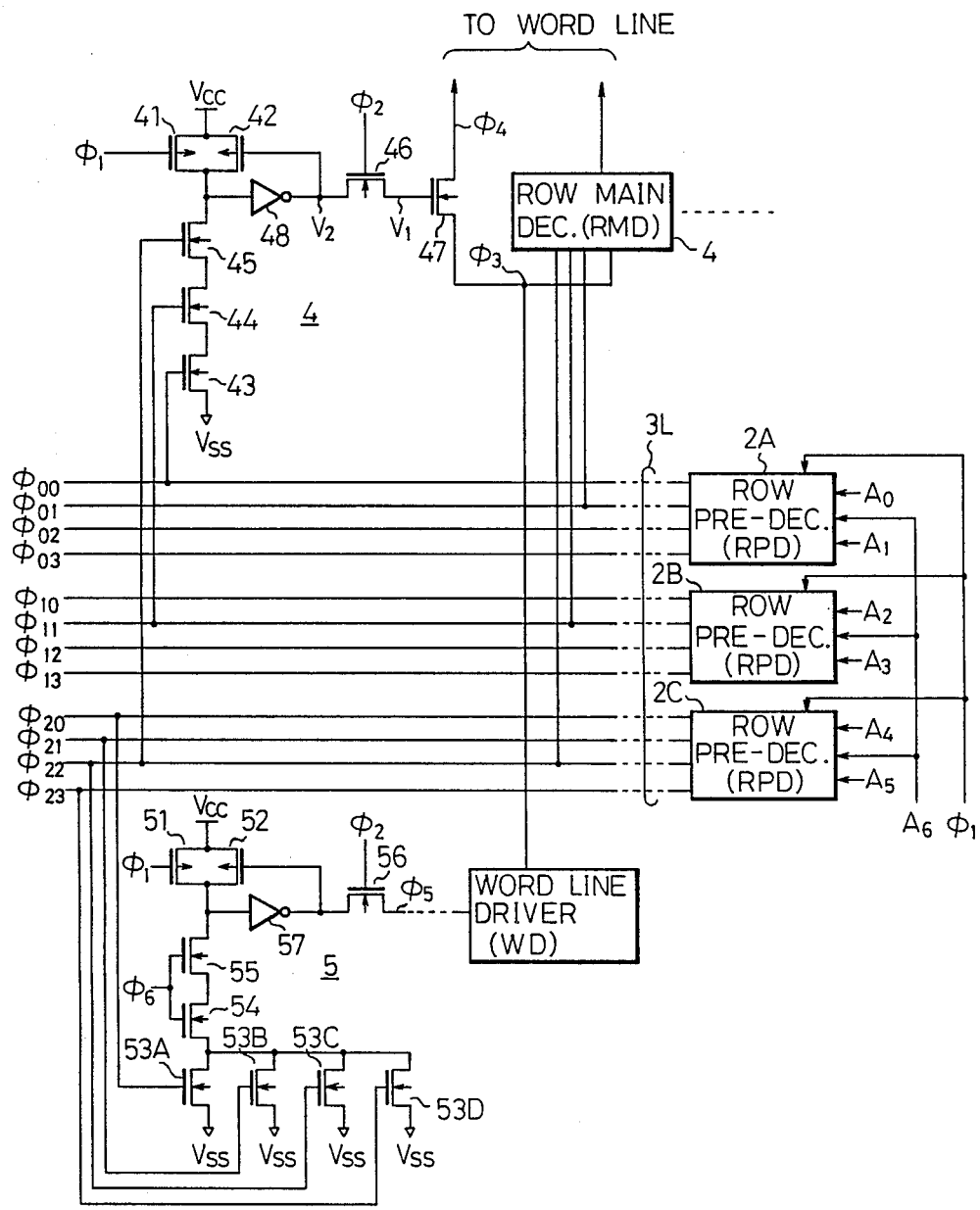
FIG. 3 is a circuit diagram illustrating a concrete constitution of main parts of the device shown rn FIG. 2.

In FIG. 3, the row pre-decoders 2A–2C respond to a combination of each logic level of the address bits $A_0$, $A_1$; $A_2$, $A_3$; $A_4$, $A_5$, respectively, and output a group of four row pre-decode signals $\phi_{00}$–$\phi_{03}$; $\phi_{10}$–$\phi_{13}$; $\phi_{20}$–$\phi_{23}$, respectively. In this case, the pre-decoding is carried out so that, in a selection state, only one signal is at "H" level in each group consisting of four signals and the other three signals are at "L" level. For example, where the address bits $A_0$, $A_1$, $A_2$, $A_3$, $A_4$ and $A_5$ are at "L", "L", "H", "L", "L" and "H", respectively, only row pre-decode signals of $\phi_{00}$, $\phi_{11}$ and $\phi_{22}$ are brought to "H" level. Reference $\phi_1$ denotes a pre-charge signal, which is applied to each of the row pre-decoders.

The row main decoder 4 is constituted by two p-channel MOS transistors 41, 42, five n-channel MOS transistors 43–47 and an inverter 48.

The transistors 43, 44, 45 are connected in series and a source of the transistor 43 is connected to a lower power supply line Vss (0 V). A drain of the transistor 45 is connected via the transistors 41, 42 connected in parallel with each other to a higher power supply line Vcc (5 V) and connected to an input end of the inverter 48. Each gate of the transistors 43, 44, 45 is connected to a signal line corresponding to one signal (in the example of the row main decoder 4 shown in the left side, $\phi_{00}$, $\phi_{11}$ and $\phi_{22}$) among each group consisting of four signals on the row pre-decode wiring 3L, respectively.

On the other hand, a gate of the transistor 41 receives the pre-charge signal $\phi_1$, which is lowered to "L" level in a stand-by state and raised to "H" level in an active state. An output end of the inverter 48 is connected to a gate of the transistor 42 and connected via the transistor 46 to a gate of the transistor 47. The output signal of the inverter 48 is indicated by reference $V_2$. A gate of the transistor 46 receives a signal $\phi_2$, which has an enough level to turn ON the transistor 46. A source of the transistor 47 is connected to an output end of the word line driver 6 and a drain thereof is connected to a corresponding word line. The transistor 47 has a function of responding to a gate signal $V_1$ of "H" level, transmitting a signal $\phi_3$ of "H" level output from the word line driver to the corresponding word line and boosting the level of the word line. The signal transmitted to the word line is indicated by reference $\phi_4$.

The row main decoder 4 shown in the left side carries out a logic of NOT and AND (NAND) in response to three row pre-decode signals $\phi_{00}$, $\phi_{11}$ and $\phi_{22}$. Accordingly, only when the logic levels of the signals $\phi_{00}$, $\phi_{11}$ and $\phi_{22}$ are all at "H" level, the level at the input end of the inverter 48 is pulled down to the level of Vss ("L" level). As a result, the output signal $V_2$ of the inverter 48 is brought to "H" level, which is applied via the transistor 46 to the gate of the transistor 47. At this time, the level of the word line is raised or boosted (i.e., selection of the word line).

The pseudo row decoder 5 is constituted by two p-channel MOS transistors 51, 52, seven n-channel MOS transistors 53A–53D, 54–56 and an inverter 57.

The transistors 53A–53D are connected in parallel and each source thereof is connected to the lower power supply line Vss. Each drain of the transistors 53A–53D is connected via the transistor 54, the transistor 55 and the transistors 51, 52 connected in parallel with each other to the higher power supply line Vcc. A drain of the transistor 55 is connected to an input end of the inverter 57. Each gate of the transistors 53A–53D is connected to each signal line corresponding to a group of signals (in the illustrated example, $\phi_{20}$–$\phi_{23}$) arriving last at the pseudo row decoder 5 among the plurality of row pre-decode signals output on the row pre-decode wiring 3L, respectively.

Also, a gate of the transistor 51 receives the pre-charge signal $\phi_1$ and each gate of the transistors 54, 55 receives a signal $\phi_6$ having an enough level to turn ON the transistors 54, 55. An output end of the inverter 57 is connected to a gate of the transistor 52 and connected via the transistor 56 to the word line driver 6. A gate of the transistor 56 receives the same signal $\phi_2$ as that of the transistor 46. A signal appearing at the drain of the transistor 56 is indicated by reference $\phi_5$.

As is obvious from the comparison of the constitution between the pseudo row decoder 5 and the row main decoder 4, the pseudo row decoder 5 includes transistors having the same number of logic stages as those in the row main decoder. In the illustrated example, the transistors 43, 44 and 45 correspond to the transistors 53A (or 53B–53D), 54 and 55. Furthermore, each of the corresponding transistors has the same gate length and gate width. Therefore, the pseudo row decoder 5 can simulate a decoding operation of the row main decoder 4.

Figure 4:
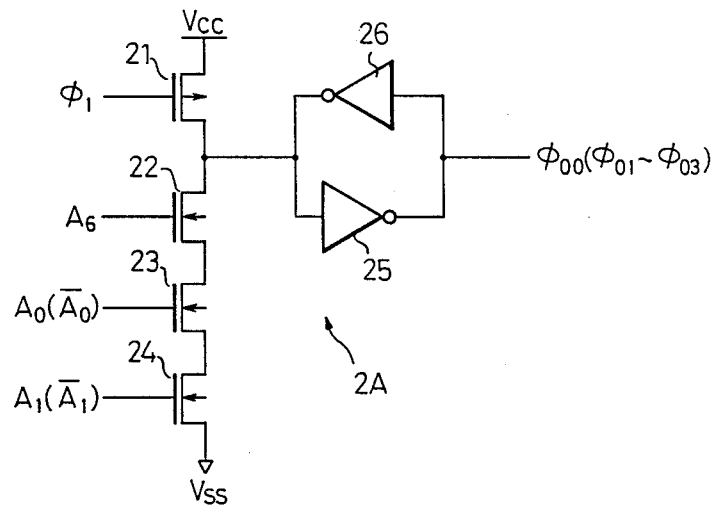
FIG. 4 is a circuit diagram illustrating a constitution of the row pre-decoder shown in FIG. 3.

FIG. 4 illustrates a circuit constitution of the row pre-decoder shown in FIG. 3.

The illustrated row pre-decoder is constituted by one p-channel MOS transistor 21 and three n-channel MOS transistors 22–24 connected in series between the two power supply lines Vcc, Vss, and a pair of inverters 25, 26 connected in parallel and in the reverse direction between a drain of the transistor 22 and the output end. The transistors 21–24 respond to the pre-charge signal $\phi_1$, the address bit $A_6$, $A_0$ or $\overline{A_0}$, $A_1$ or $\overline{A_1}$, respectively. For example, where the address bit $A_0$ and $A_1$ are input, the now pre-decode signal $\phi_{00}$ is obtained. Thus, in the actual constitution, the row pre-decoder 2A is constituted by four circuits, each shown in FIG. 4. The constitution of the other row pre-decoders is the same as that of the row pre-decoder 2A and thus the explanation thereof is omitted.

Figure 5:
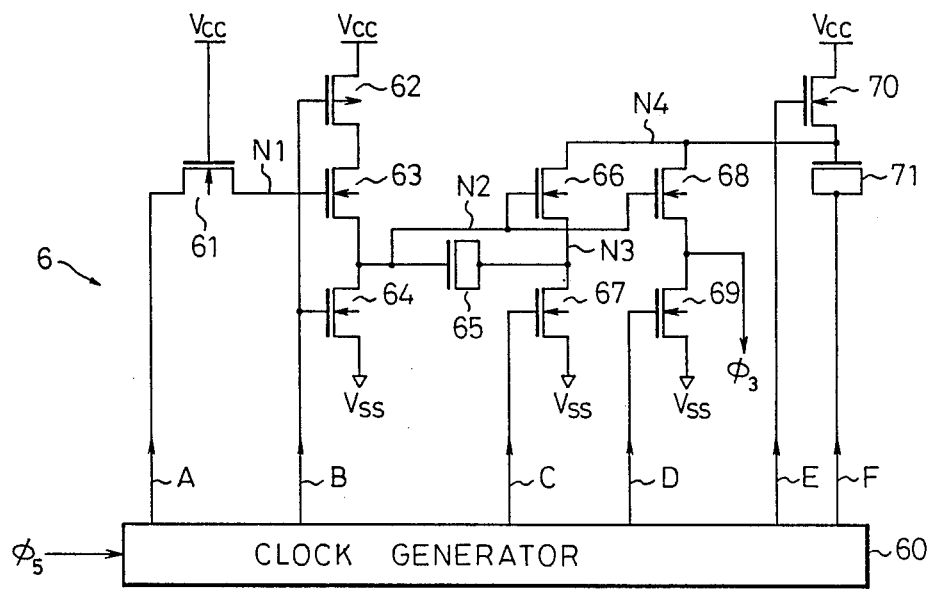
FIG. 5 is a circuit diagram illustrating a constitution of the word line driver shown in FIG. 3.
Figure 6:
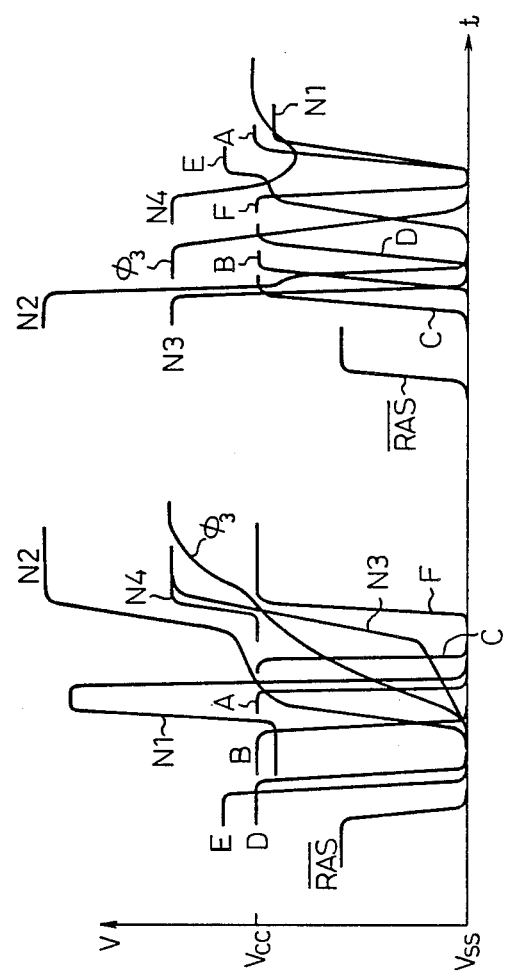
FIG. 6 is a timing chart for explaining the operation of the word line driver shown in FIG. 5.

FIG. 5 illustrates a circuit constitution of the word line driver shown in FIG. 3 and FIG. 6 shows a timing chart of the operation thereof.

The illustrated word line driver 6 is constituted by a clock generator 60 generating clock signals A–F with timings shown in FIG. 6 in response to the signal $\phi_5$, one p-channel MOS transistor 62, eight n-channel MOS transistors 61, 63, 64, 66–70 and two MOS capacitors 65, 71.

A gate of the transistor 61 is connected to the power supply line Vcc and a source thereof receives the clock signal A. The transistors 62, 63, 64 are connected in series between the power supply lines Vcc and Vss. A gate of the transistor 63 is connected to a drain of the transistor 61 (node N1) and each gate of the transistors 62, 64 receives the clock signal B. A drain of the transistor 64 (node N2) is connected to one end of the capacitor 65 and each gate of the transistors 66, 68. The transistors 66, 67 are connected in series between node N4 and the power supply line Vss. A drain of the transistor 67 (node N3) is connected to another end of the capacitor 65 and a gate thereof receives the clock signal C. The transistors 68, 69 are connected in series between node N4 and the power supply line Vss and a gate of the transistor 69 receives the clock signal D. The output signal $\phi_3$ of the word line driver 6 is obtained from the drain of the transistor 69. The node N4 is connected to a source of the transistor 70 and one end of the capacitor 71. A drain of the transistor 70 is connected to the power supply line Vcc and a gate thereof receives the clock signal E. Also, another end of the capacitor 71 receives the clock signal F.

In FIG. 6, reference $\overline{RAS}$ denotes a low active row address strobe signal, which is generated by a controller (not shown) in response to the row address signal RA. Initially, since the clock signal A is at "H" level (Vcc), the potential at node N1 is at "H" level (approximately Vcc). Also, since the clock signals B, C, D are at "H" level (Vcc), the potentials at nodes N2, N3 and the output signal $\phi_3$ are at "L" level (Vss), respectively. Also, since the clock signal E is at "H" level (Vcc+Vth, where Vth is a threshold level of the transistor 70), the potential at node N4 is at "H" level (Vcc).

When the row address strobe signal $\overline{RAS}$ is lowered to "L" level and then the clock signals E, D, B are sequentially lowered to "L" level, the transistor 62 is turned ON. As a result, the drain voltage of the transistor 63 is raised to "H" level (Vcc) and, accordingly, the potential at node N1 is boosted over the level of Vcc and the potential at node N2 is raised to the level of Vcc. Accordingly, the transistors 66, 68 are turned ON, so that the potential at node N3 and the output signal $\phi_3$ starts rising in level. Next, when the clock signal A is lowered to "L" level, the transistor 61 is turned ON. As a result, charges at node N1 flow through the transistor 61 into the clock generator 60 and the potential at node N1 is lowered to "L" level. Next, when the clock signal C is lowered to "L" level, the transistor 67 is turned OFF. As a result, the potential at node N3 is abruptly raised and, accordingly, the potential at node N2 is further boosted with the aid of the capacitor 65. Then, when the clock signal F is raised to "H" level, the potential at node N4 is boosted with the aid of the capacitor 71. Finally, the potential at node N3 and the output signal $\phi_3$ are settled to the same level as the potential at node N4.

The output signal $\phi_3$ of "H" level is used for driving a selected word line by way of the row main decoder 4, as stated later. When the row address strobe signal $\overline{RAS}$ is raised to "H" level, the output signal $\phi_3$ is lowered to "L" level.

Next, the decoding operation of the circuit shown in FIG. 3 will be explained with reference to FIGS. 7A and 7B, which show operational timings of each signal in the row main decoder 4 and the pseudo row decoder 5, respectively.

In FIGS. 7A and 7B, the signal $\phi_2$ is first raised to the level of Vpc (Vcc+Vth, where Vth is a threshold level of the transistors 46, 56). Next, the pre-charge signal $\phi_1$ is raised to "H" level and then the signal $\phi_6$ and the row pre-decode signals $\phi_{00}$, $\phi_{11}$ are raised to "H" level. After a small delay, the row pre-decode signal $\phi_{22}$ is raised to "H" level. At this time, since the transistors 43, 44, 45 are all brought to the ON state, the level at the input end of the inverter 48 is pulled down to the level of Vss ("L" level). At the same time, since the transistors 53C, 54, 55 are all brought to the ON state, the level at the input end of the inverter 57 is pulled down to the level of Vss ("L" level). As a result, the level at the output end of each inverter is brought to "H" level and, accordingly, each drain voltage of the transistors 46, 56, i.e., each level of the signals $V_1$, $\phi_5$, is brought to "H" level (Vcc). At this time, the signal $\phi_2$ is lowered to the level of Vcc.

In this state, since the output signal $\phi_3$ of the word line driver 6 is at "L" level (Vss), the transistor 47 is brought to the ON state. When the signal $\phi_3$ is then raised over the level of Vcc, the level of $\phi_3$ is transmitted via the transistor 47 to the corresponding word line (selected word line), so that the word line is boosted over the level of Vcc. Namely, when the signal $V_1$ is raised to "H" level (Vcc), the row main decoder 4 completes its main decoding. The timing of the completion of the main decoding is determined by the arrival time of the signal $\phi_{22}$ contained in the group arriving last at the pseudo row decoder 5 among the plurality of row pre-decode signals output on the row pre-decode wiring 3L. Accordingly, the timing of the completion of the main decoding is the same as the timing at which the output signal $\phi_5$ of the pseudo row decoder 5 is raised to "H" level.

The word line driver 6 starts its operation in response to the "H" level output signal $\phi_5$ of the pseudo row decoder 5. Namely, the wait time needed from when the row pre-decode signals are output until the operation of the word line driver 6 is started is determined depending on the operation of the pseudo row decoder 5. Therefore, it is possible to always realize the optimum wait time regardless of the nonuniformity of process, fluctuation of temperature, or the like. As a result, it is possible to perfectly exclude a possibility of an erroneous operation in the selection of word lines and prevent an unnecessary prolongation of the access time.

Also, it is known that the space occupied by wiring regions on a chip is relatively large compared with the space occupied by other integrated circuits. Although, in the present embodiment, the space corresponding to the pseudo row decoder 5 is required, the input signal lines of the pseudo row decoder 5, i.e., the row pre-decode wiring 3, 3L, 3R, are common to the row main decoder 4. Namely, it is unnecessary to newly provide signal wiring regions. Therefore, it is possible to relatively reduce the space occupied by the entire device on the chip.

Although the present invention has been disclosed and described by way of one embodiment, it is apparent to those skilled in the art that other embodiments and modifications of the present invention are possible without departing from the spirit or essential features thereof.

We claim:

1. A semiconductor memory device comprising:
   a memory cell array including a plurality of word lines;
   a row pre-decoding means responsive to a row address signal, outputting a plurality of row pre-decode signals with units of a group having signals of a number corresponding to a combination of each logic level of a predetermined plurality of bits of said row address signal;
   a row pre-decode wiring for transmitting said plurality of row pre-decode signals; and
   a row main decoder responsive to one signal in each group of said plurality of row pre-decode signals, carrying out a main decoding for selecting one of said plurality of word lines;
   a pseudo row decoder having substantially same electrical characteristics as said row main decoder, carrying out a simulation of said main decoding in response to said plurality of row pre-decode signals output on said row pre-decode wiring; and
   a word line driver for driving a word line selected by said row main decoder to a predetermined level, an operation of said word line driver being started in response to an activation of said pseudo row decoder.

2. A device as set forth in claim 1, wherein said row pre-decoding means comprises a plurality of row pre-decoders and said pseudo row decoder carries out said simulation in response to the output of a row pre-decoder located at the farthest position therefrom among said plurality of row pre-decoders.

3. A device as set forth in claim 2, comprising said memory cell array in a plurality of numbers, wherein said plurality of memory cell arrays are divided into two regions and said plurality of row pre-decoders are provided between said two regions and divided into a first half allocated for one of said two regions and a second half allocated for another thereof, one of said first and second halves being selected in response to a select signal.

4. A device as set forth in claim 3, wherein each of said plurality of row pre-decoders comprises a plurality of transistors connected in series and responding to each of said predetermined plurality of bits of the row address signal, and outputs said group of row pre-decode signals in accordance with the ON/OFF operation of said transistors in a selection state.

5. A device as set forth in claim 2, wherein said row main decoder comprises a plurality of transistors connected in series and responding to one signal in each group of said plurality of row pre-decode signals output on said row pre-decode wiring, respectively, and outputs a first signal indicating a result of said main decoding in accordance with the ON/OFF operation of said plurality of transistors.

6. A device as set forth in claim 5, wherein said row main decoder further comprises a first transistor connected between an output end of said word line driver and one of said plurality of word lines and a second transistor responding to a second signal having an enough level to turn ON said second transistor and transferring said first signal to a gate of said first transistor.

7. A device as set forth in claim 6, wherein said first transistor drives a corresponding word line to said predetermined level based on an output signal of said word line driver when said first signal applied to the gate thereof represents a selection of the corresponding word line.

8. A device as set forth in claim 7, wherein said pseudo row decoder comprises a plurality of transistors connected in parallel and responding to each signal among said group arriving last at said pseudo row decoder, respectively, and outputs an activation signal for said word line driver in response to the ON operation of at least one of said plurality of transistors.

9. A device as set forth in claim 8, wherein said pseudo row decoder further comprises a transistor responding to said second signal and transferring said activation signal to said word line driver with the same timing as that in the transfer operation of said second transistor.

10. A device as set forth in claim 9, wherein said word line driver outputs said output signal for driving a selected word line to said predetermined level on receiving said activation signal.

11. A device as set forth in claim 1, wherein said substantially same electrical characteristics of the pseudo row decoder are defined by the same number of logic stages as those in said row main decoder.

12. A device as set forth in claim 1, wherein said pseudo row decoder carries out said simulation in response to a group arriving last at said pseudo row decoder among said plurality of row pre-decode signals output on said row pre-decode wiring.

* * * * *

UNITED STATES PATENT AND TRADEMARK OFFICE
CERTIFICATE OF CORRECTION

PATENT NO. : 4,932,000
DATED : June 5, 1990
INVENTOR(S) : KODAMA et al

It is certified that error appears in the above-identified patent and that said Letters Patent is hereby corrected as shown below:

On the cover page, Item [73] "Fujitsu Limited; Fujitsu Limited" should read --Fujitsu Limited, Kawasaki; Fujitsu VLSI Limited, Kasugai, both of Japan--.

Signed and Sealed this

Fifth Day of November, 1991

*Attest:*

HARRY F. MANBECK, JR.

*Attesting Officer*     *Commissioner of Patents and Trademarks*